United States Patent [19]
Anderson et al.

[11] Patent Number: 5,602,457
[45] Date of Patent: Feb. 11, 1997

[54] PHOTOVOLTAIC SOLAR CELL LAMINATED IN VEHICLE WINDSHIELD

[75] Inventors: Carl J. Anderson, Lake Orion; Howard E. Mitchell, Clarkston, both of Mich.

[73] Assignee: Exide Corporation, Reading, Pa.

[21] Appl. No.: 663,376

[22] Filed: Jun. 13, 1996

Related U.S. Application Data

[63] Continuation of Ser. No. 367,820, Jan. 3, 1995, abandoned.

[51] Int. Cl.$^6$ .............................. H02J 7/00; B32B 17/00; B60J 1/00
[52] U.S. Cl. .............................. 320/2; 428/437; 428/336; 296/84.1
[58] Field of Search ................................ 320/2; 428/437, 428/336; 296/84.1

[56] References Cited

U.S. PATENT DOCUMENTS

| | | | |
|---|---|---|---|
| 4,277,538 | 7/1981 | Beckmann et al. | 428/429 |
| 4,303,739 | 12/1981 | Beckmann et al. | 428/437 X |
| 4,327,316 | 4/1982 | Fujikubo et al. | |
| 4,786,851 | 11/1988 | Fuji et al. | |
| 4,952,460 | 8/1990 | Beckmann et al. | 428/429 |
| 4,976,503 | 12/1990 | Woodard | 296/84.1 |
| 5,106,671 | 4/1992 | Amberger et al. | 428/336 X |
| 5,234,748 | 8/1993 | Demiryont et al. | 428/428 X |
| 5,245,468 | 9/1993 | Demiyont et al. | 428/428 X |
| 5,268,208 | 12/1993 | Krisko et al. | |
| 5,346,770 | 9/1994 | Osada et al. | 336/437 X |
| 5,352,505 | 10/1994 | Krisko et al. | |

OTHER PUBLICATIONS

Photovoltaic Solar Modules Technical Data Sheet (2 pages), Solar Web™ Products.
"References" (1 through 26), Racing With the Sun – EIX 88–06 02366 et al.
Dendritic Web Photovoltaic Program Summary Report, Research Project 2611–1, Jun., 1989 (pp. 1–47).
NERAC, Photovoltaic Power for Automobiles (PAT), J. Kelley et al, Jul. 12, 1988, Q. 619722.
NERAC, Photovoltaic Power for Automobiles (EDB), J. Kelley et al, Jul. 12, 1988, Q. 619722.
NERAC, Photovoltaic Power for Automobiles (EIM), J. Kelley et al, Jul. 12, 1988, Q. 619722.
NERAC, Photovoltaic Power for Automobiles (NAS), J. Kelley et al, Jul. 12, 1988, Q. 619722.
NERAC, Photovoltaic Power for Automobiles (INS), J. Kelley et al, Jul. 12, 1988, Q. 619722.
NERAC, Photovoltaic Power for Automobiles (EIX), J. Kelley et al, Jul. 12, 1988, Q. 619722.
Web Photovoltaic Power (6 page brochure).
Joint Declaration of Carl J. Anderson and Howard E. Mitchell (pp. 1–6) & Exhibits A through D.

Primary Examiner—Peter S. Wong
Assistant Examiner—K. Shin
Attorney, Agent, or Firm— Nixon & Vanderhye P.C.

[57] ABSTRACT

A laminated windshield in which thin solar cells are sandwiched between the glass layer. The solar cell is electrically connected to a vehicle battery to provide recharging current to the battery from the electrical current generated by the solar cells. The solar cells may be formed of dendrite solar cells arranged in flexible strings. These solar cell strings may be positioned in the windshield proximate to an edge of the windshield and superimposed over windshield tinting or darkened border areas of the windshield.

15 Claims, 2 Drawing Sheets

PHOTOVOLTAIC SOLAR CELL LAMINATED IN VEHICLE WINDSHIELD

This is a continuation of application Ser. No. 08/367,820, filed Jan. 3, 1995, now abandoned.

BACKGROUND OF THE INVENTION

1. Field of the Invention

This invention relates to vehicle battery charging systems and, in particular, photovoltaic solar recharging cells for vehicle batteries.

2. Description of the Prior Art

Historically, automotive batteries have been used to power the starter of an internal combustion engine of most automobiles. Similar battery and starter systems are used for most other vehicles. The electromotive starter imposes a heavy load on the battery and each start of the engine drains the battery of a measurable portion of the stored energy in the battery. Alternators and generators recharge the battery while the engine is running. While the engine is not running, no substantial load was applied (until recent years) to the battery until the starter was operated to start the engine, which in turn, activated the alternator or generator to recharge the battery. Accordingly, the battery was not drained until immediately before the engine was started when the battery was recharged by the running engine. Since the battery was not subjected to any substantial load while the engine was off, at least until the starter was activated, the battery could retain sufficient charge indefinitely (for at least several months). Accordingly, in the distant past, batteries did not require charging while the engine was off, even when the vehicle was not started for several weeks or months.

In the recent past, many small electrical devices have been added to automobiles and other vehicles that draw electrical current while the engine is not running. For example, automobiles are equipped with digital clocks, courtesy lights, electronic security systems, computer systems, cellular telephones and mobile radios that require electrical power from the vehicular battery while the engine is not running. While the power drain of each of these devices may be relatively small individually as compared to the storage capacity of the battery, the cummulative effect of all of these devices, especially over an extended period of time, often times is sufficient to drain the battery of electrical energy such that the battery has insufficient power to start the engine. Accordingly, there has been a growing need over the last ten or more years for devices that charge vehicular batteries while the engine is not running.

The most common system for recharging automotive batteries is while the vehicle engine is not running is an external battery charger that plugs into a electrical wall socket and applies a low electrical charge to the battery with clamps attached to the terminal posts of the battery. The clamps of the battery charger are removed before starting the engine and driving the vehicle. This becomes a safety issue in that naturally-occurring explosive hydrogen and oxygen gases are present at the battery vents, and disconnecting the clamps can create a spark which could possibly ignite these gases and cause a battery explosion while a person is directly adjacent to the battery, thereby causing bodily harm. In more recent years, photovoltaic solar cells have been adapted to charge vehicular batteries. Such solar cells have been incorporated onto the surface of the metal or plastic skin of the roof, window surfaces or other upwardly facing segment of the vehicle body. Similarly, external solar cells are available that plug into a cigarette lighter of an automobile and apply a low charge to the battery.

In these prior attempts to adapt solar cells to charge a battery of a vehicle, the solar cells applied to the surfaces of the vehicle have suffered such disadvantages as being difficult to paint (most paints obstruct solar light that must reach the photovoltaic cells) or, if not painted, disgrace the appearance of the vehicle. External solar cells have the disadvantage that they must be manually set up each time the battery is to be charged and most people do not desire to be bothered with setting up such solar cells. In addition, most manufacturers of solar cells have packaged solar cells into protective units that are rigid and relatively thick. These solar cell units are attached to the vehicle. The resulting attached solar cell unit does not readily merge atheistically or practically with the vehicle. Instead, prior attempts to add solar cells to a vehicle have resulted in a highly visible solar cell attached to a vehicle. Accordingly, there is a long an resolved need for a solar cell system for charging vehicular batteries that does not disrupt the atheistical qualities of the vehicle.

Furthermore, prior to the current invention, thin film solar cells were not directly incorporated into the surfaces of a vehicle. Solar cells had to be packaged to protect the fragile and rigid cells before they were integrated into the vehicle. The packaging provided adequate shielding of the solar cell, but was difficult to integrate into the surfaces of the vehicle. To avoid some of the difficulties with packaged solar cells, there were prior art attempts to form solar cells on the surfaces of vehicle sunroofs by vacuum deposition of an amorphous silicon layer on the secondary glass surface. Amorphous silicon technology is well known to be the least efficient of the photovoltaic solar cell materials, and therefore, requires between 2 to 4 times as much exposed surface area be manufactured or incorporated into a vehicle surface to produce an equivalent amount of energy as this patent application describes. Amorphous silicon technology has several other disadvantages including that the solar cell layer on the outer surface of the glass is easily destroyed by being scratched or otherwise damaged. In addition, the electrical connections to the exposed surface layer are themselves exposed and susceptible to being damaged. Accordingly, these prior art techniques for adapting solar cells for use as vehicle battery recharges have proven to be less than satisfactory and have not frilly solved the need for a passive vehicle battery recharger.

BRIEF SUMMARY OF THE INVENTION

The current invention is a solar powered battery recharger system comprising photovoltaic solar cells laminated between the glass layers of a vehicle windshield, connections between the solar cells and the battery of the vehicle and associated circuitry. It has been discovered that thin solar cells can be sandwiched between the layers of a windshield, without disrupting the desired properties of the windshield and yielding enhanced performance of the solar cells.

Previously, it was thought that solar cells were incompatible with windshields, because the solar cells block light and windshields must maintain high visibility. A main purpose of a vehicle windshield is to provide a window through which the driver of the vehicle sees the oncoming road and traffic. A driver's visibility cannot be substantially obstructed as would occur if conventional solar cell packaged units were located on a windshield. Solar cells are opaque and prevent the transmission of visible light through the windshield. Indeed, solar cells are intended to adsorb photons, including those in the visible light spectrum, and are not transparent to visible light as are windshields. Accordingly, at first blush it appeared that a windshield is the last place on an automobile on which to locate a solar cell.

These inventors have found that there are minimal areas on a typical windshield that can support a flexible and thin solar cell. These windshield areas are already opaque, and include the black border (frit) area near the perimeter of the windshield and the "blue band" tinted area at the top of the windshield. These areas of the windshield are visible to sunlight, and sufficient to accommodate the solar cells needed to recharge a vehicle battery. However, these areas are not situated in a single location of the windshield but are rather dispersed around the windshield. Accordingly, a way was needed to adapt the solar cells to the dispersed areas on the windshield that could accommodate a solar cell. The inventors adapted existing solar cell technology by forming "strings" of solar cells instead of conventional solar cell panels, and arranging these strings of cells to fit the non-transparent areas of a windshield.

The non-transparent areas of the windshield are near the edges of the windshield where windshields curve in compound convex and concave surfaces. Traditional solar cells are planar, rigid and mounted in flat panel units. Such traditional solar cells do not readily bend to the complex curved surfaces of current-day windshields. Accordingly, a flexible, thin solar cell, that need not be formed in extended contiguous panels was needed. The inventors determined, after several years of experimentation, that thin solar cells could be strung together as cell strings, rather than the typical solar cell panel. These strings were flexible and could be shaped to fit the narrow areas available to solar cells on a windshield.

In addition, the inventors laminated the stringed solar cells between the glass layers of a windshield. Laminating the solar cells was particularly difficult in that packaged solar cells are too thick to be laminated into a windshield and are too rigid to deform to conform to the complex shapes of a windshield. The inventors tried to laminate a few different types of solar cells before discovering that dendrite solar cell technology is particularly suitable for lamination within a windshield. In addition, the inventors adapted the dendrite solar cells to fit in the peripheral areas of a windshield away from the areas of the windshield that must be kept transparent for good visibility. It was found that by locating strings of solar cells on the black "frit" and tinted border areas in a windshield that the opaque solar cells could be laminated into the windshield without reducing the visibility of the windshield needed for safe driving. Laminating solar cells into a windshield yielded unexpected advantages including that some of the sunlight photons are adsorbed into the solar cells due to the glass lamination rather than being reflected from conventional solar cells. Accordingly, the electrical output power of the solar cell string is enhanced by laminating the solar cell into the windshield as compared to the output power of conventional solar cell arrangements.

BRIEF DESCRIPTION OF THE DRAWINGS

These, as well as other objects and advantages of this invention, will be more completely understood and appreciated by careful study of the following more detailed description of a presently preferred exemplary embodiment of the invention taken in conjunction with the accompanying drawings, of which.

DETAILED DESCRIPTION OF THE DRAWINGS

Figure 1:
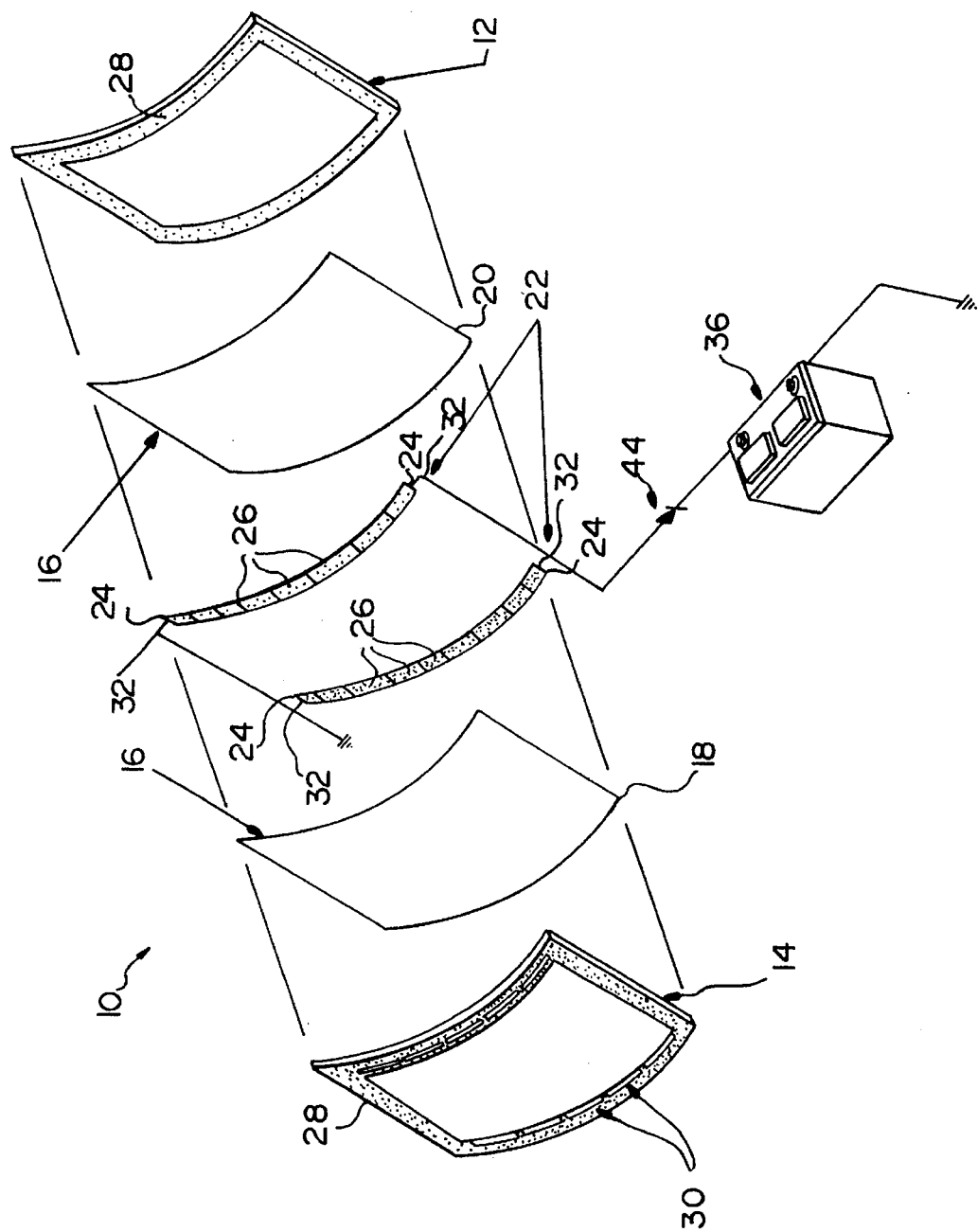
FIG. 1 is an exploded view of the layers of a laminated windshield, including a solar cell layer.

FIG. 1 shows a laminated windshield 10 having inside 12 and outside 14 glass layers shaped to fit the windshield aperture of a particular vehicle. In many instances, these windshield layers will have a complex, non-planar shape, depending on the windshield configuration that the designer of the vehicle has selected. Typically, these glass layers are formed of tempered glass and are laminated together to form shatterproof windshield glass. The glass layers are typically formed of a pair of flat glass panes, about 1.5 mm thick, that are cut to a specified geometry for the windshield. The glass panes are heated together and allowed to "gravity sag" into the particular desired windshield geometry to produced the required compound curves of the windshield. The contoured glass layers are cooled and separated. These glass layers are laminated together (with solar cells between the glass layers) using known techniques for forming shatter-proof windshield glass.

A pair of polyvinyl butyryl (PVB) layers 16 is inserted between the separated glass layer. In one embodiment of the invention, a first PVB layer 18 is approximately 0.38 mm thick and the second PVB layer 20 has a thickness in the range from approximately 0.38 mm to approximately 0.76 mm. The thicker PVB layer provides a cushion to accommodate the contacts 22 to the solar cell strings 24 sandwiched between the pair of PVB layers. The PVB layers are flexible and deform to fit the contours of the glass layers. In conventional windshield forming processes, a single PVB layer is sandwiched between the glass layers. In an embodiment of the current invention, the pair of PVB layers 16 is substituted for the single PVB layer used in conventional windshield formation processes. The pair of PVB layers provides a sandwich structure within which to contain the solar cells and contacts between the laminated glass layers of the windshield.

The solar cell strings 24 may be formed of strings of individual dendritic web solar cells 26, such as products manufactured by EBARA Solar, Inc., of Large, Pa., formerly Blue Ridge Industrial Development Group, Inc. Dendritic web solar cells are flexible, thin, e.g., 0.13 mm thick, and highly efficient photovoltaic cells. Each cell is a thin strip of web material that can be formed to suit a particular windshield application. Other types of solar cells may also be adapted for use in the invention. In this regard, the inventors have conducted experiments with laminating amorphous silicon and single crystal silicon solar cells into windshields. These experiments were not completely successful. The single crystal silicon solar cell experiment involved a rigid solar cell that was 0.65 mm thick and, thus, was too thick to readily incorporate into a laminated windshield and too rigid to conform to the complex shape of a windshield. The amorphous silicon cell experiment also involved a relatively thick, e.g., 0.5 mm, solar cell that was not readily laminated into a windshield and the thick solar cell yielded windshield assembly difficulties and poor optical characteristics in the windshield. Accordingly, the best mode of practicing the invention is to laminate a dendritic web solar cell between layers of PVB and glass to form a windshield.

The solar cell strings are located near the periphery of the windshield, where the visibility through the windshield is not needed. For example, most windshields include a black "frit" border area 28 that is silk screened onto the glass layers of the windshield. Clear openings 30 may be left in the outside glass layer 14 for the solar cells. The active portions (the portions that convert light photons into electricity) of the solar cell strings are aligned with these openings so as to receive sunlight through the outer layer of the windshield. Similarly, the solar cell strings may be aligned with the tinted area of many windshields, formed by tinting the inner PVB layer 20. While the solar cell string will obstruct a portion of the tinted area of the windshield, the cell strings can be positioned so as to not interfere with visibility through the windshield. In the embodiment of the invention shown in FIG. 1, an array of solar cells is stretched across top and bottom regions of the windshield. Electrical connections between each of the cells in each string are incorporated into the solar cell strings and are located on the side of the cell adjacent the thicker PVB layer 20. In this way, the connections are protected by the thick PVB layer and are not crushed by the glass layer.

Figure 2:
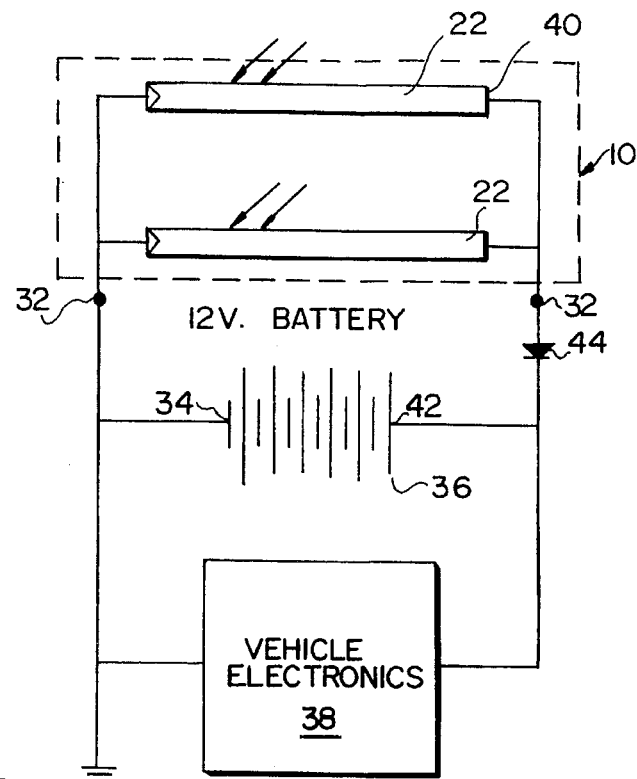
FIG. 2 is a schematic circuit diagram of a windshield solar cell system for battery recharging and supplying electrical power to electronic systems in the vehicle.

External electrical connections 32 to the solar cell strings are made conventionally at the periphery of the windshield. These connections should be weatherproof to avoid corrosion from environmental conditions, including rain, snow, ice, salt water and road salts. As shown in FIGS. 1 and 2, the pair of solar cell strings in the disclosed embodiment are connected in parallel with one side of each cell string coupled to ground. As is conventional, the negative terminal 34 of the vehicular battery 36 and a terminal end of most of the vehicle electronics 38 are also grounded. The battery 36 and vehicle electronics 38 may be connected in parallel to the solar cell strings. The positive side 40 of the solar cell strings are connected to the positive ten, final 42 of the battery and to an active terminal end of the vehicle electronics 38. In addition, a diode 44, such as a schottky diode, must be integrated into the line from the positive side of the solar cell string to the positive terminal of the battery to prevent the solar cells from draining stored electrical energy from the battery.

Figure 3:
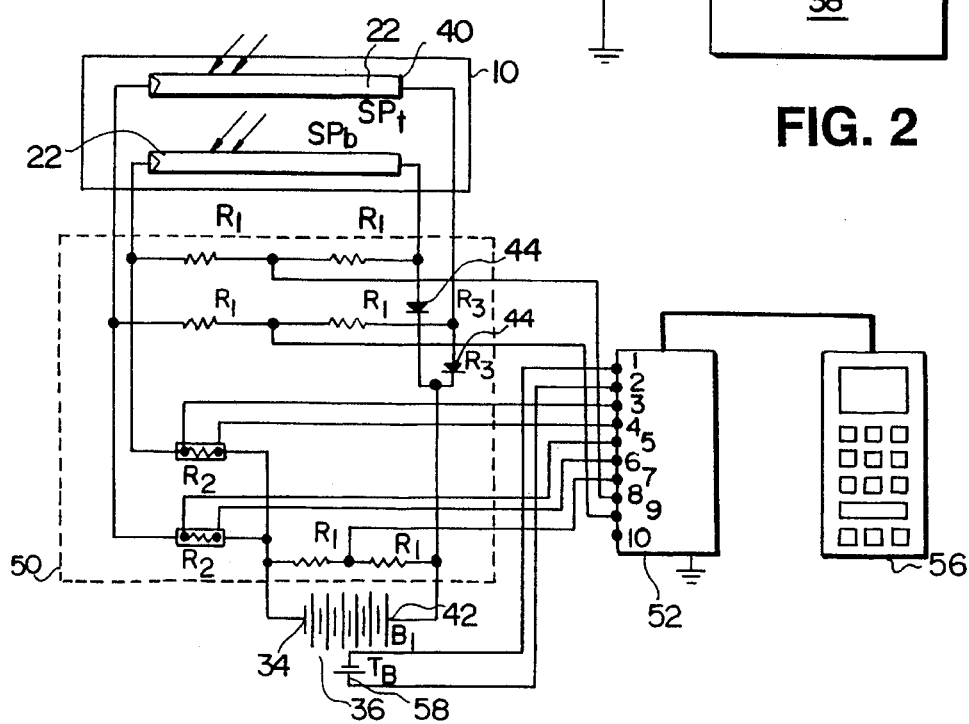
FIG. 3 is a schematic diagram of an alternative circuit for a windshield solar cell system which includes data logging and testing equipment.

Whereas the circuitry for connecting the solar cell strings to a battery and internal vehicle electronics is limited to several connection lines and a diode 44 in the circtfit shown in FIG. 2. FIG. 3 illustrates a slightly more complex circuit for incorporating an external electronic device, such as a computer data recorder, into a solar cell battery recharger. As shown in FIG. 3, the associated circuitry 50 for the solar cell battery recharger includes a pair of diodes 44, one for each cell string, which is the minimal circuitry needed for the solar cell strings. In addition, a pair of shunt resistors (R2 e.g., 100 mV, 1 amp) and several voltage dividing resistors (R1, e.g., 100 k Ohm, 0.25 w) are provided to provide connections between the solar cell strings and an electronic interface 52. Using this interface, an electronic instrument, such as a data logger 56, may be coupled to the solar cell circuitry to measure power from the solar cells and monitor the operation of the solar cell and battery. In addition, a temperature measuring probe, such as a thermocouple 58, may be attached to the battery to provide signals indicative of the temperature of the battery. Such temperature signals are required in determining the operational state of the battery.

The invention has been described in connection with its preferred embodiment. The invention is not to be limited to the disclosed embodiment. Rather, the invention covers various modifications and equivalent arrangements included within the spirit and scope of the appended claims.

What is claimed is:

1. A laminated windshield for a moving vehicle comprising:

outer and inner glass layers both having substantially the same non-planar shape;

first and second layers of PVB, and a string of solar cells sandwiched between said first and second layers of PVB which are sandwiched between the outer and inner glass layers that are laminated together.

2. A laminated windshield as in claim 1 wherein said string of solar cells is a dendrite solar cell material.

3. A laminated windshield as in claim I wherein said string of solar cells is arranged and located proximate a perimeter of said windshield.

4. A laminated windshield as in claim I wherein the first layer of PVB is substantially thicker than the second layer of PVB and electrical connections for the solar cells are arranged on a side of the cells adjacent the first layer of PVB.

5. A laminated windshield as in claim 4 wherein the first layer of PVB has a thickness in the range of approximately 0.38 mm to 0.76 mm.

6. A laminated windshield as in claim 4 wherein the second layer of PVB has a thickness of approximately 0.38 mm.

7. A laminated windshield and battery for a moving vehicle comprising:

outer and inner glass layers both having substantially the same complex curved shape, and a opaque or translucent border area proximate at least one edge of the glass layers;

first and second layers of PVB having a shape substantially the same shape as the shape of the glass layers;

a string of dendrite solar cell strings sandwiched between said first and second layers of PVB which are sandwiched between the outer and inner glass layers that are laminated together, wherein the solar cell strings are superimposed over the border area of the glass layers, and wherein the vehicle battery is electrically coupled to said solar cell strings to receive a recharging current from the solar cell string.

8. A laminated windshield and battery as in claim 7 further comprising an electrical connection between a positive terminal of the battery and the solar cell strings and wherein the electrical connection consists of a low resistance electrical path and a diode.

9. A laminated windshield as in claim 7 wherein said string of solar cells is a dendrite solar cell material.

10. A laminated windshield as in claim 7 wherein multiple strings of solar cells are arranged proximate to the perimeter edge of said windshield.

11. A laminated windshield as in claim 7 wherein the first layer of PVB is substantially thicker than the second layer of PVB and electrical intercell connections for the solar cells are arranged on a side of the cells adjacent the first layer of PVB.

12. A laminated windshield as in claim 7 wherein the first layer of PVB has a thickness in the range of approximately 0.38 mm to 0.76 mm.

13. A laminated windshield as in claim 7 wherein the second layer of PVB has a thickness of approximately 0.38 mm.

14. A laminated windshield as in claim 7 wherein the battery is connected in parallel to the solar cell strings.

15. A laminated windshield as in claim 7 further comprising at least one electronic device connected in parallel to the battery and solar cell, and said electronic device receiving electrical current for measuring or power from the solar cell string.

* * * * *